United States Patent
Lin et al.

(10) Patent No.: US 11,476,843 B2
(45) Date of Patent: Oct. 18, 2022

(54) SIGNAL RECEIVING DEVICE AND BIAS VOLTAGE CALIBRATION CIRCUIT THEREOF

(71) Applicant: ALi Corporation, Hsinchu (TW)

(72) Inventors: Yen Liang Lin, Taipei (TW); Ming-Ta Lee, Taipei (TW)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 17/315,361

(22) Filed: May 10, 2021

(65) Prior Publication Data

US 2022/0149825 A1 May 12, 2022

(30) Foreign Application Priority Data

Nov. 11, 2020 (CN) .......................... 202011250666.4

(51) Int. Cl.
*H03K 17/14* (2006.01)
*H03K 5/01* (2006.01)
*H03F 3/45* (2006.01)

(52) U.S. Cl.
CPC ........... *H03K 5/01* (2013.01); *H03F 3/45475* (2013.01); *H03K 17/145* (2013.01)

(58) Field of Classification Search
CPC ................................. H03K 5/01; H03K 17/145
See application file for complete search history.

(56) References Cited

U.S. PATENT DOCUMENTS

| | | | | |
|---|---|---|---|---|
| 5,966,003 A | * | 10/1999 | Takimoto | H02M 3/156 323/224 |
| 2003/0038617 A1 | * | 2/2003 | Yaklin | G05F 3/24 327/524 |
| 2003/0080807 A1 | * | 5/2003 | Dasgupta | G05F 3/30 327/543 |
| 2006/0097759 A1 | * | 5/2006 | Omori | H03K 17/6872 327/108 |
| 2013/0154684 A1 | | 6/2013 | Cho et al. | |
| 2016/0306376 A1 | | 10/2016 | Nee et al. | |
| 2019/0222203 A1 | * | 7/2019 | Tripoli | G05F 1/577 |
| 2019/0346872 A1 | * | 11/2019 | Bae | G05F 3/16 |

* cited by examiner

*Primary Examiner* — Sibin Chen
(74) *Attorney, Agent, or Firm* — JCIPRNET

(57) ABSTRACT

The disclosure provides a bias voltage calibration circuit adapted for a signal receiving device. The bias voltage calibration circuit includes a reference voltage generator, a voltage-current converter, and a bias current generator. The reference voltage generator receives a voltage adjustment signal, and adjusts a voltage value of a generated reference voltage according to the voltage adjustment signal. The voltage-current converter is coupled to the reference voltage generator, and converts the reference voltage to generate a reference current. The bias current generator generates a plurality of bias currents according to the reference current, and provides the bias current to an equalization circuit of the signal receiving device in a calibration mode.

13 Claims, 4 Drawing Sheets

SIGNAL RECEIVING DEVICE AND BIAS VOLTAGE CALIBRATION CIRCUIT THEREOF

CROSS-REFERENCE TO RELATED APPLICATION

This application claims the priority benefit of China application serial no. 202011250666.4, filed on Nov. 11, 2020. The entirety of the above-mentioned patent application is hereby incorporated by reference herein and made a part of this specification.

BACKGROUND

Technical Field

The disclosure relates to a signal receiving device and a bias voltage calibration circuit thereof, in particular, to a signal receiving device and a bias voltage calibration circuit thereof that reduce an error caused by process variation and temperature change.

Description of Related Art

In a signal receiving device, an equalizer performs the determination of the input voltage according to the bias current and generates corresponding input data. In actual applications, the bias current may often be incorrect due to the change in the process, the voltage, and the temperature. In the conventional technique, a bandgap reference voltage generating circuit is often used to provide a reference voltage, and the bias current is generated according to the reference voltage. However, the circuit size of the bandgap reference voltage generating circuit is usually large and has a certain degree of error. Moreover, in the conventional technique, the bias current often needs to be generated with an external resistor. The external resistor also occupies a certain circuit area, and its external mechanism also provides a path for external noise to be coupled into the signal receiving device, which affects the accuracy of the signal receiving device.

SUMMARY

The disclosure relates to a signal receiving device and a bias voltage calibration circuit thereof that reduce an error caused by process variation and temperature change.

According to an embodiment of the disclosure, a bias voltage calibration circuit is adapted for a signal receiving device. The bias voltage calibration circuit includes a reference voltage generator, a voltage-current converter, and a bias current generator. The reference voltage generator receives a voltage adjustment signal, and adjusts a voltage value of a reference voltage that is generated according to the voltage adjustment signal. The voltage-current converter is coupled to the reference voltage generator, and converts the reference voltage to generate a reference current. The bias current generator generates a plurality of bias currents according to the reference current, and provides the bias current to an equalization circuit of the signal receiving device in a calibration mode.

According to an embodiment of the disclosure, a signal receiving device includes an equalization circuit, a bias voltage calibration circuit, and a switch assembly. The equalization circuit has a first terminal resistor and a second terminal resistor, and generates an output voltage according to a first input voltage and a second input voltage. The bias voltage calibration circuit includes a reference voltage generator, a voltage-current converter, and a bias current generator. The reference voltage generator receives a voltage adjustment signal, and adjusts a voltage value of a reference voltage that is generated according to the voltage adjustment signal. The voltage-current converter is coupled to the reference voltage generator, and converts the reference voltage to generate a reference current. The bias current generator generates a first bias current and a second bias current according to the reference current. The switch assembly respectively provides the first bias current and the second bias current to the first terminal resistor and the second terminal resistor in a calibration mode.

According to the above, in the disclosure, the voltage value of the generated reference voltage is adjusted according to the voltage adjustment signal in the calibration mode through the bias voltage calibration circuit, so as to adjust the bias current of the signal receiving device and prevent the bias current from having an error due to the change in the process, the voltage, and the temperature. The accuracy of the received signal of the signal receiving device is maintained without an external resistor.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
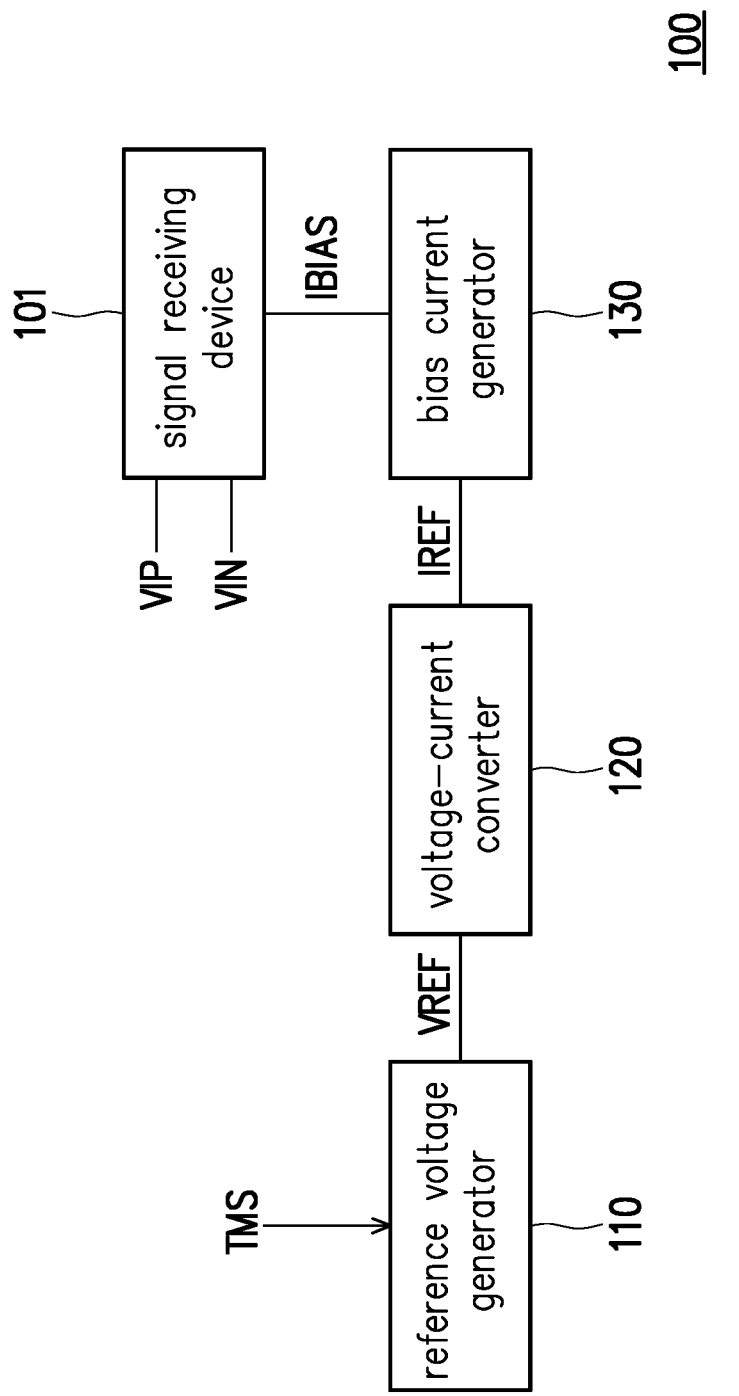
FIG. 1 is a schematic view of a bias voltage calibration circuit according to an embodiment of the disclosure.

Hereinafter, exemplary embodiments of the disclosure will be described in detail, and examples of the exemplary embodiments are illustrated in accompanying drawings. Whenever possible, the same reference numerals are used in the drawings and descriptions to indicate the same or similar parts.

Referring to FIG. 1, FIG. 1 is a schematic view of a bias voltage calibration circuit according to an embodiment of the disclosure. A bias voltage calibration circuit 100 is adapted for a signal receiving device 101. The bias voltage calibration circuit 100 includes a reference voltage generator 110, a voltage-current converter 120 and a bias current generator 130. The reference voltage generator 110 receives a voltage adjustment signal TMS. The reference voltage generator 110 is used to generate a reference voltage VREF, and the reference voltage generator 110 adjusts a voltage value of the generated reference voltage VREF according to the voltage adjustment signal TMS. The voltage-current converter 120 is coupled to the reference voltage generator 110. The voltage-current converter 120 receives the reference voltage VREF, and converts the reference voltage VREF to generate a reference current IREF. The bias current generator 130 is coupled to the voltage-current converter 120 and the signal receiving device 101. The bias current generator 130 receives the reference current IREF, and generates a bias current IBIAS according to the reference current IREF. The bias current generator 130 provides the bias current IBIAS to an equalization circuit of the signal receiving device 101 in a calibration mode, and determines whether the bias current IBIAS is an ideal bias current according to data sensed by the equalization circuit.

More specifically, in this embodiment of the disclosure, the voltage adjustment signal TMS may be adjusted in the calibration mode. For example, when the bias current IBIAS provided by the bias current generator 130 is a first current, it means that the bias current IBIAS at this time is not an ideal current if the data sensed by the equalization circuit of the signal receiving device 101 is not the ideal data. Accordingly, the bias voltage calibration circuit 100 may adjust a value of the bias current IBIAS by adjusting the voltage adjustment signal TMS, so that the bias current IBIAS may be adjusted to be equal to the ideal current. In this way, in a normal operating mode, the signal receiving device 101 performs the operation of signal receiving according to the adjusted bias current IBIAS, and obtains an accurate received signal.

Regarding an adjustment of the voltage adjustment signal TMS, the voltage adjustment signal TMS may be a digital signal. Moreover, the adjustment is performed according to a flowchart of a method for adjusting a voltage adjustment signal according to an embodiment of the disclosure shown in FIG. 2. First, in this embodiment, the voltage adjustment signal TMS may be a digital signal with one or more bits. Moreover, a plurality of digital values provided by the voltage adjustment signal TMS respectively correspond to a plurality of voltage values. In step S210, a bias voltage calibration circuit first sets a default voltage adjustment signal. After that, in the calibration mode, a bias current is generated to a signal receiving device according to the currently set voltage adjustment signal, and in step S220, an output voltage generated by an equalization circuit of the signal receiving device is measured. In step S230, the bias voltage calibration circuit determines whether the output voltage generated by the equalization circuit is equal to an ideal voltage. The adjustment of the voltage adjustment signal is ended when the determination result is yes, or when the determination result is no, a value of the voltage adjustment signal is increased or decreased in step S240, and step S210 is executed again to reset the voltage adjustment signal.

Steps S210 to S240 may be repeatedly executed until the determination result of step S230 is yes. Accordingly, the bias voltage calibration circuit may provide a bias current that is not affected by the change in the process, the voltage, and the temperature.

Note that the ideal voltage in the step S230 is an output voltage generated by the equalization circuit in an ideal state where the signal receiving device is not affected by the change in the process, the voltage, or the temperature. The ideal voltage may be a default voltage, and the bias voltage calibration circuit may perform step S230 by comparing the output voltage generated by the equalization circuit with the ideal voltage. In addition, in step S240, the bias voltage calibration circuit may determine whether to increase or decrease the value of the voltage adjustment signal, and determine an adjustment range of the value of the voltage adjustment signal according to the comparison in step S230. Therein, the bias voltage calibration circuit may determine whether to increase or decrease the value of the voltage adjustment signal according to the relationship between the output voltage and the ideal voltage, and determine the adjustment range of the value of the voltage adjustment signal according to an absolute value of a difference between the output voltage and the ideal voltage.

In this embodiment, the value of the voltage adjustment signal may be recorded in a buffer, and the above calibration mode may be executed at any time according to the requirements of the user.

Figure 3:
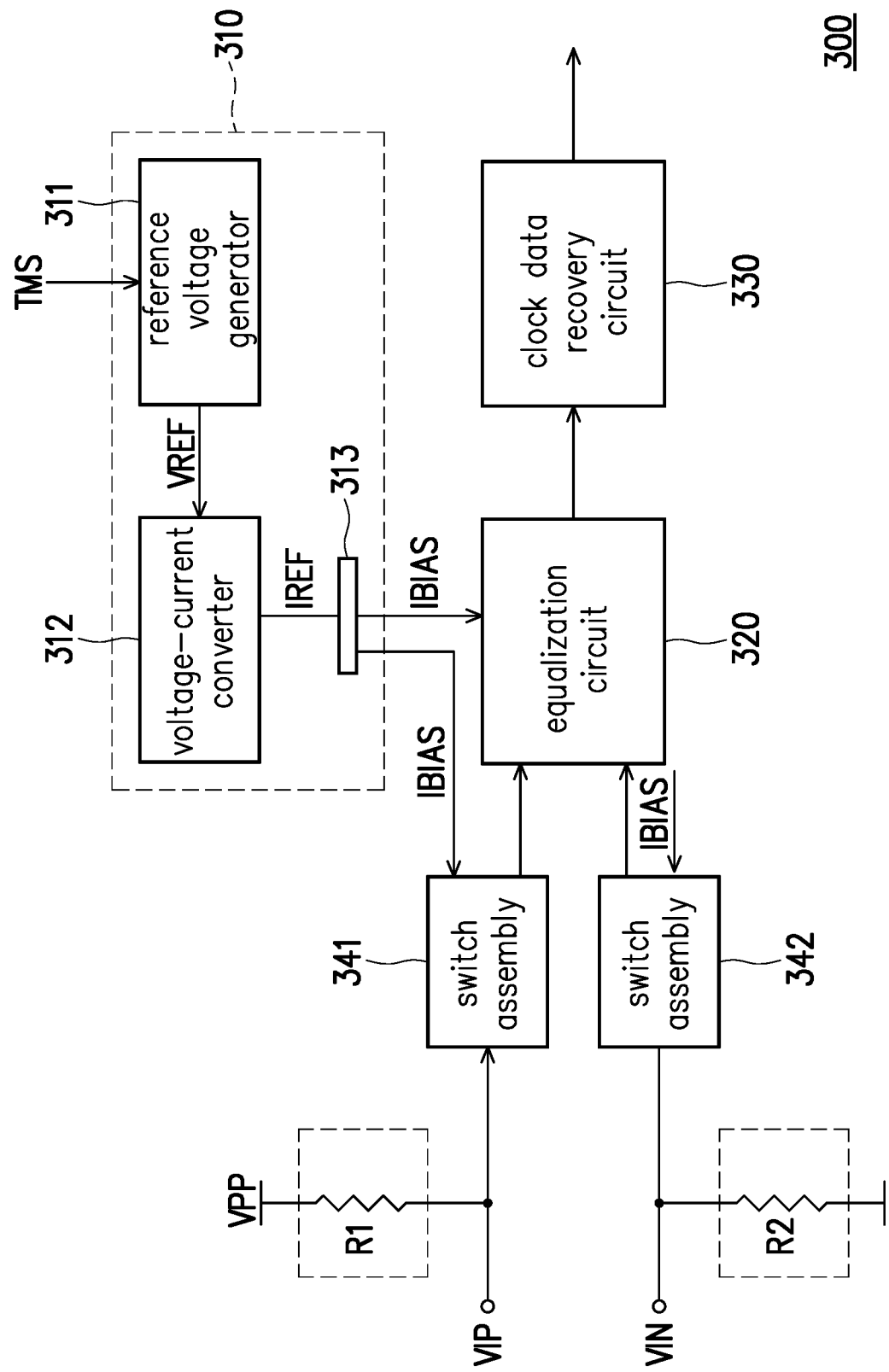
FIG. 3 is a schematic view of a signal receiving device according to an embodiment of the disclosure.

Hereinafter, referring to FIG. 3, FIG. 3 is a schematic view of a signal receiving device according to an embodiment of the disclosure. A signal receiving device 300 includes a bias voltage calibration circuit 310, an equalization circuit 320, a clock data recovery circuit 330, switch assemblies 341 and 342, and terminal resistors R1 and R2. The bias voltage calibration circuit 310 is coupled to the equalization circuit 320 and provides the bias current IBIAS to the equalization circuit 320 in the calibration mode. Two input ends of the equalization circuit 320 are coupled to the switch assemblies 341 and 342, and respectively coupled to the terminal resistors R1 and R2. Therein, one end of the terminal resistors R1 and R2 is pulled up to a power supply voltage VPP. The two input ends of the equalization circuit 320 respectively receive input voltages VIP and VIN which are differential signals through the switch assemblies 341 and 342 respectively in the normal operating mode (non-calibration mode). An output end of the equalization circuit 320 is coupled to the clock data recovery circuit 330. The clock data recovery circuit 330 obtains input data according to an output voltage generated by the equalization circuit 320.

In this embodiment, the bias voltage calibration circuit 310 includes a reference voltage generator 311, a voltage-current converter 312 and a bias current generator 313. The reference voltage generator 311 receives the voltage adjustment signal TMS, and generates the reference voltage VREF according to the voltage adjustment signal TMS. The voltage-current converter 312 is used to convert the reference voltage VREF to generate the reference current IREF. The bias current generator 313 generates the bias current IBIAS by mirroring the reference current IREF. In this embodiment, the bias current generator 313 provides the bias current IBIAS to the switch assemblies 341 and 342, and the equalization circuit 320. In the calibration mode, the switch assemblies 341 and 342 block the input voltages VIP and VIN from being transmitted to the equalization circuit 320. At this time, the bias current IBIAS flows through the terminal resistor R1 through the switch assembly 341 to generate a first input voltage of the equalization circuit 320, and the bias current IBIAS flows through the terminal resistor R2 through the switch assembly 342 to generate a second input voltage of the equalization circuit 320. In this way, the equalization circuit 320 cooperates with the terminal resistors R1 and R2 to generate the output voltage according to the bias current IBIAS.

Figure 2:
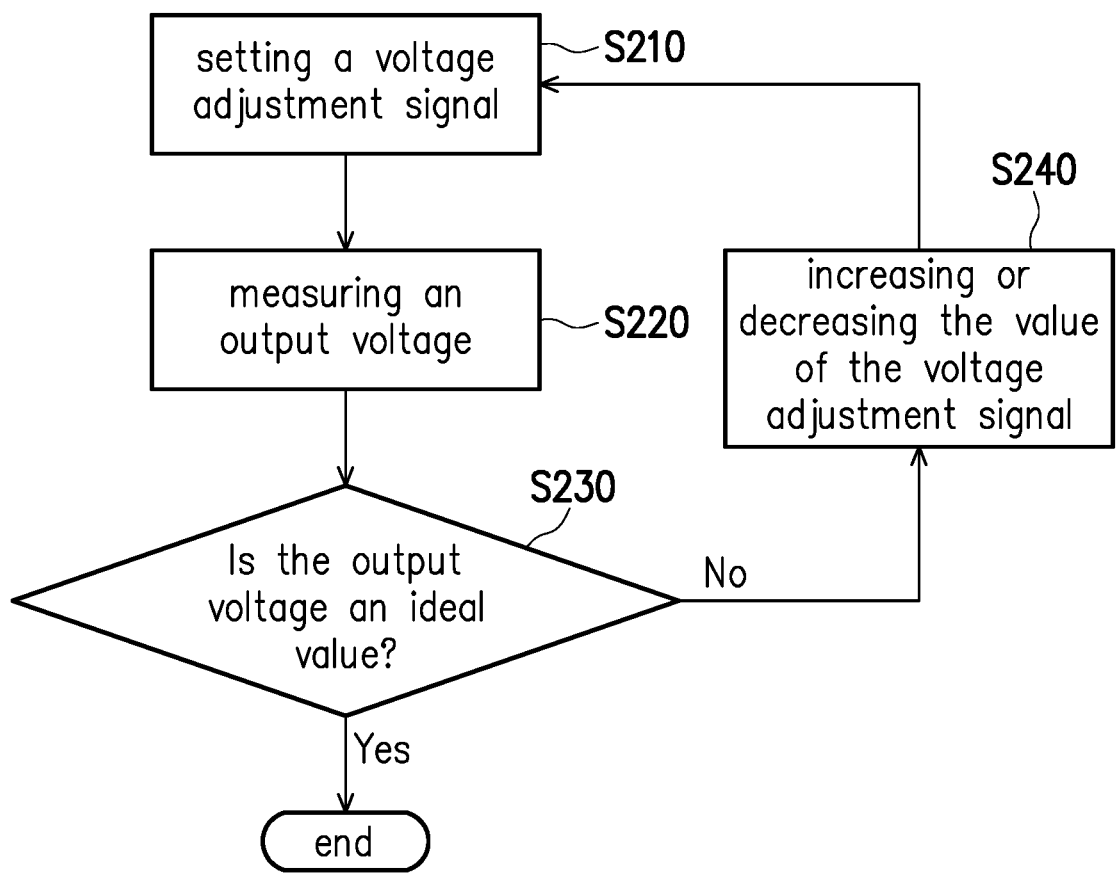
FIG. 2 is a flowchart of a method for adjusting a voltage adjustment signal according to an embodiment of the disclosure.

In the calibration mode, according to the workflow of FIG. 2, the bias current IBIAS is equal to the ideal value through the adjustment of the voltage adjustment signal TMS. In this way, the bias voltage calibration circuit 310 in this embodiment of the disclosure generates the bias current IBIAS that is independent of the change in the process, the voltage, and the temperature.

Figure 4:
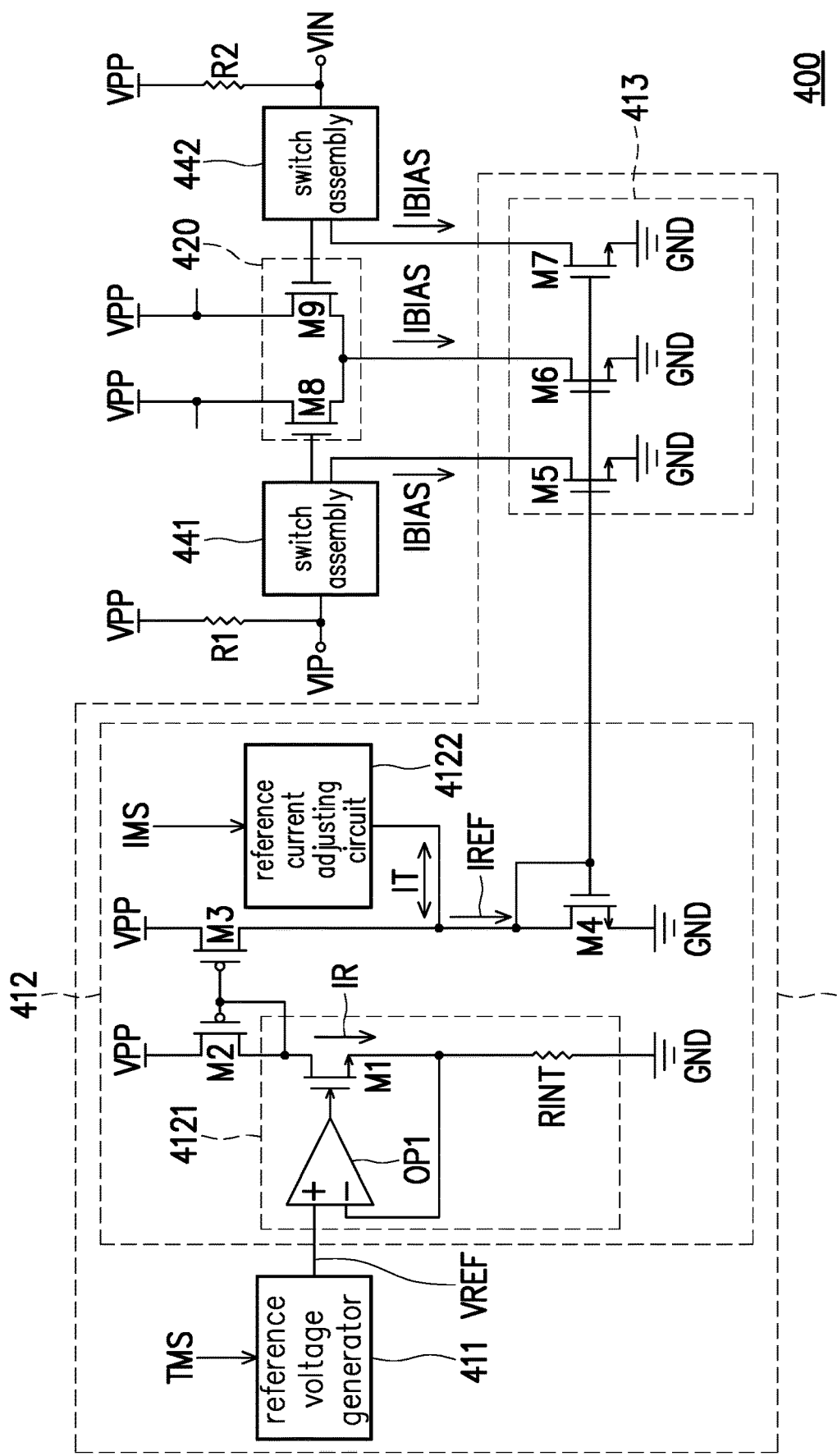
FIG. 4 is a schematic view of a signal receiving device according to another embodiment of the disclosure.

Referring to FIG. 4, FIG. 4 is a schematic view of a signal receiving device according to another embodiment of the disclosure. A signal receiving device 400 includes a bias voltage calibration circuit 410, an equalization circuit 420, switch assemblies 441 and 442, and terminal resistors R1 and R2. The bias voltage calibration circuit 410 includes a reference voltage generator 411, a voltage-current converter 412 and a bias current generator 413. In this embodiment, the voltage-current converter 412 includes a current generating circuit 4121, transistors M2 to M4, and a reference current adjusting circuit 4122.

The current generating circuit 4121 includes an operational amplifier OP1, a transistor M1, and an internal resistor RINT. A positive input end of the operational amplifier OP1 receives the reference voltage VREF provided by the reference voltage generator 411. Therein, the voltage value of the reference voltage VREF is adjusted according to the voltage adjustment signal TMS. A negative input end of the operational amplifier OP1 is coupled to a second end of the transistor M1, and a first end of the transistor M1 is coupled to a second end of the transistor M2. An output end of the operational amplifier OP1 is coupled to a control end of the transistor M1. The internal resistor RINT is connected in series between the negative input end of the operational amplifier OP1 and a reference ground end GND. The operational amplifier OP1, the transistor M1, and the internal resistor RINT form a current source, and generate a current IR according to the reference voltage VREF. In addition, the transistors M2 to M4 form a current mirror circuit, and generates the reference current IREF by mirroring the current IR.

In this embodiment, the reference current adjusting circuit 4122 is additionally coupled to a generating path of the reference current IREF. The reference current adjusting circuit 4122 applies or draws an adjustment current IT from a coupling ends of the transistors M3 and M4 according to a current adjustment signal IMS to increase or decrease a current value of the reference current IREF. The reference current adjusting circuit 4122 may be a voltage-controlled current source, and the current adjustment signal IMS may be a digital signal or an analog signal.

In addition, the bias current generator 413 includes a current mirror circuit formed by transistors M5 to M7. The transistors M5 to M7 are coupled to the transistor M4 and receive the same bias voltage as the transistor M4. The transistors M5 to M7 generates a plurality of bias currents IBIAS by mirroring the reference current IREF. Therein, the bias currents IBIAS generated by the transistors M5 to M7 are respectively provided to the switch assembly 441, the equalization circuit 420, and the switch assembly 442.

On the other hand, the equalization circuit 420 includes transistors M8 and M9. The transistors M8 and M9 are coupled to each other in a differential pair. First ends of the transistors M8 and M9 receive the power supply voltage VPP, and control ends of the transistors M8 and M9 are respectively coupled to the switch assemblies 441 and 442, while second ends of the transistors M8 and M9 are mutually coupled to the transistor M6. Therein, the control ends of the transistors M8 and M9 may be two input ends of the equalization circuit 420. Through the operations of the switch assemblies 441 and 442, in the calibration mode, the input voltages VIP and VIN are not provided, and the switch assemblies 441 and 442 allow the bias currents IBIAS respectively generated by the transistors M5 and M7 to flow through the terminal resistors R1 and R2. In the normal operating mode, the switch assemblies 441 and 442 isolate the transistors M5 and M7 from the terminal resistors R1 and R2, and allow the input voltages VIP and VIN to be provided to the transistors M8 and M9.

In this embodiment, in the calibration mode, the current generating circuit 4121 generates the current IR, and the current mirror circuit generates the reference current IREF through the current mirroring of the transistors M2 to M4. In this embodiment, a mirror ratio of the current of the current mirror circuit formed by the transistors M2 to M4 is not particularly limited and may be determined by the designer. In addition, the transistors M5 to M7 generates the bias currents IBIAS by mirroring the reference current IREF. The bias currents IBIAS generated by the transistors M5 to M7 may all be equal. According to the bias current IBIAS flowing through the terminal resistors R1 and R2, the two input ends of the equalization circuit 420 generate two input voltages, and the equalization circuit 420 generates an output voltage according to the two input voltages.

Similar to the previous embodiment, the voltage adjustment signal TMS may be adjusted, and the voltage value of the reference voltage VREF may be adjusted accordingly by comparing the output voltage generated by the equalization circuit 420 with the ideal voltage. In this embodiment, the reference current adjusting circuit 4122 may be used to adjust the reference current IREF according to the current adjustment signal IMS, and set the output voltage generated by the equalization circuit 420 to be equal to the ideal voltage. In this embodiment, the adjustment of the voltage adjustment signal TMS may be a rough adjustment, while an adjustment of the current adjustment signal IMS may be a fine adjustment.

Incidentally, the reference voltage generator 411 in this embodiment of the disclosure may be implemented using any form of voltage generator, and there is no particular limit.

According to the above, the signal receiving device of an embodiment of the disclosure obtains the bias current that is equal to the ideal current by adjusting the voltage adjustment signal and the current adjustment signal in the calibration mode. In this way, the accuracy of the input data obtained by the signal receiving device is improved, and the error caused by the change in the process, the voltage, and the temperature is reduced.

Finally, it should be noted that the above embodiments are merely used to illustrate not to limit the technical solutions of the disclosure. Although the disclosure has been described in detail with reference to the foregoing embodiments, those of ordinary skill in the art should understand that they can still modify the technical solutions described in the foregoing embodiments, or equivalently replace some or all of the technical features. These modifications or replacements do not cause the essence of the corresponding technical solutions to deviate from the scope of the technical solutions of the embodiments of the disclosure.

What is claimed is:

1. A bias voltage calibration circuit adapted for a signal receiving device, comprising:
    a reference voltage generator receiving a voltage adjustment signal, and adjusting a voltage value of a reference voltage that is generated according to the voltage adjustment signal;
    a voltage-current converter coupled to the reference voltage generator, and converting the reference voltage to generate a reference current; and
    a bias current generator generating a plurality of bias currents according to the reference current, and in a calibration mode, providing the plurality of bias currents to an equalization circuit of the signal receiving device,
    wherein the voltage adjustment signal is adjusted based on an output voltage of the equalization circuit of the signal receiving device.

2. The bias voltage calibration circuit according to claim 1, wherein the voltage-current converter comprises:
a current generating circuit generating a first current according to the reference voltage and an internal resistor; and
a first current mirror circuit coupled to the current generating circuit, and mirroring the first current to generate the reference current.

3. The bias voltage calibration circuit according to claim 2, wherein the bias current generator comprises a second current mirror circuit mirroring the reference current to generate the plurality of bias currents.

4. The bias voltage calibration circuit according to claim 2, wherein the voltage-current converter further comprises:
a reference current adjusting circuit coupled to the first current mirror circuit and adjusting the reference current according to a current adjustment signal.

5. The bias voltage calibration circuit according to claim 2, wherein the current generating circuit comprises:
an operational amplifier having a positive input end to receive the reference voltage;
a transistor having a control end coupled to an output end of the operational amplifier, a first end of the transistor receiving an operating power supply, and a second end of the transistor coupled to a negative input end of the operational amplifier; and
the internal resistor coupled between the second end of the transistor and a reference ground end.

6. A signal receiving device, comprising:
an equalization circuit coupled to a first terminal resistor and a second terminal resistor, and generating an output voltage according to a first input voltage and a second input voltage;
a bias voltage calibration circuit, comprising:
a reference voltage generator receiving a voltage adjustment signal, and adjusting a voltage value of a reference voltage that is generated according to the voltage adjustment signal;
a voltage-current converter coupled to the reference voltage generator, and converting the reference voltage to generate a reference current; and
a bias current generator generating a first bias current and a second bias current according to the reference current; and
a switch assembly, in a calibration mode, respectively providing the first bias current and the second bias current to the first terminal resistor and the second terminal resistor,
wherein the voltage adjustment signal is adjusted based on an output voltage of the equalization circuit of the signal receiving device.

7. The signal receiving device according to claim 6, further comprising:
a clock data recovery circuit coupled to the equalization circuit and generating received data according to the output voltage.

8. The signal receiving device according to claim 6, wherein the voltage-current converter comprises:
a current generating circuit generating a first current according to the reference voltage and an internal resistor; and
a first current mirror circuit coupled to the current generating circuit, and mirroring the first current to generate the reference current;
wherein the bias current generator comprises a second current mirror circuit mirroring the reference current to generate the first bias current and the second bias current.

9. The signal receiving device according to claim 6, wherein the voltage-current converter further comprises:
a reference current adjusting circuit coupled to the first current mirror circuit and adjusting the reference current according to the current adjustment signal.

10. The signal receiving device according to claim 6, wherein the current generating circuit comprises:
an operational amplifier having a positive input end to receive the reference voltage;
a transistor having a control end coupled to an output end of the operational amplifier, a first end of the transistor receiving an operating power supply, and a second end of the transistor coupled to a negative input end of the operational amplifier; and
the internal resistor coupled between the second end of the transistor and a reference ground end.

11. A bias voltage calibration circuit adapted for a signal receiving device, comprising:
a reference voltage generator receiving a voltage adjustment signal, and adjusting a voltage value of a reference voltage that is generated according to the voltage adjustment signal;
a voltage-current converter coupled to the reference voltage generator, and converting the reference voltage to generate a reference current; and
a bias current generator generating a plurality of bias currents according to the reference current, and in a calibration mode, providing the plurality of bias currents to an equalization circuit of the signal receiving device,
wherein the voltage-current converter comprises:
a current generating circuit generating a first current according to the reference voltage and an internal resistor; and
a first current mirror circuit coupled to the current generating circuit, and mirroring the first current to generate the reference current,
wherein the bias current generator comprises a second current mirror circuit mirroring the reference current to generate the plurality of bias currents.

12. The bias voltage calibration circuit according to claim 11, wherein the voltage-current converter further comprises:
a reference current adjusting circuit coupled to the first current mirror circuit and adjusting the reference current according to a current adjustment signal.

13. The bias voltage calibration circuit according to claim 11, wherein the current generating circuit comprises:
an operational amplifier having a positive input end to receive the reference voltage;
a transistor having a control end coupled to an output end of the operational amplifier, a first end of the transistor receiving an operating power supply, and a second end of the transistor coupled to a negative input end of the operational amplifier; and
the internal resistor coupled between the second end of the transistor and a reference ground end.

* * * * *